(12) United States Patent
Wu et al.

(10) Patent No.: US 7,894,178 B2
(45) Date of Patent: *Feb. 22, 2011

(54) THROUGH HOLE CAPACITOR AND METHOD OF MANUFACTURING THE SAME

(75) Inventors: Bang-Hao Wu, Kaohsiung (TW); Li-Duan Tsai, Hsinchu (TW); Min-Lin Lee, Hsinchu (TW); Cheng-Liang Cheng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 260 days.

This patent is subject to a terminal disclaimer.

(21) Appl. No.: 12/046,422

(22) Filed: Mar. 11, 2008

(65) Prior Publication Data
US 2009/0159322 A1  Jun. 25, 2009

(30) Foreign Application Priority Data
Dec. 21, 2007  (TW) .............................. 96149239 A

(51) Int. Cl.
*H01G 9/04* (2006.01)
*H01G 9/145* (2006.01)
*H01G 4/228* (2006.01)

(52) U.S. Cl. ....................... 361/528; 361/540; 361/541; 29/25.03

(58) Field of Classification Search ......... 361/516–519, 361/523, 525, 528–529, 540–541; 29/25.03
See application file for complete search history.

(56) References Cited

U.S. PATENT DOCUMENTS

| | | | | |
|---|---|---|---|---|
| 4,211,603 A | * | 7/1980 | Reed ............................ | 216/18 |
| 5,187,649 A | * | 2/1993 | Kudoh et al. ................. | 361/525 |
| 6,249,424 B1 | * | 6/2001 | Nitoh et al. .................. | 361/523 |
| 6,446,317 B1 | | 9/2002 | Figueroa et al. | |
| 6,518,670 B1 | | 2/2003 | Mandelman et al. | |
| 6,605,551 B2 | | 8/2003 | Wermer et al. | |
| 6,678,144 B2 | | 1/2004 | Higashi et al. | |
| 6,717,071 B2 | | 4/2004 | Chang et al. | |
| 6,882,544 B2 | | 4/2005 | Nakamura et al. | |
| 6,980,416 B2 | * | 12/2005 | Sakaguchi et al. .......... | 361/523 |
| 7,561,410 B1 | * | 7/2009 | Lee et al. .................... | 361/525 |
| 7,589,390 B2 | * | 9/2009 | Yao ............................. | 257/503 |
| 2002/0017399 A1 | * | 2/2002 | Chang et al. ................. | 174/262 |
| 2002/0122283 A1 | * | 9/2002 | Higashi et al. .............. | 361/271 |

FOREIGN PATENT DOCUMENTS

TW  525417  3/2003

* cited by examiner

*Primary Examiner*—Eric Thomas
(74) *Attorney, Agent, or Firm*—Jianq Chyun IP Office

(57) ABSTRACT

A through hole capacitor at least including a substrate, an anode layer, a dielectric layer, a first cathode layer, and a second cathode layer is provided. The substrate has a plurality of through holes. The anode layer is disposed on the inner surface of at least one through hole, and the surface of the anode layer is a porous structure. The dielectric layer is disposed on the porous structure of the anode layer. The first cathode layer covers a surface of the dielectric layer. The second cathode layer covers a surface of the first cathode layer, and the conductivity of the second cathode layer is greater than that of the first cathode layer. The through hole capacitor can be used for impedance control, as the cathode layers of the through hole are used for signal transmission.

33 Claims, 3 Drawing Sheets

THROUGH HOLE CAPACITOR AND METHOD OF MANUFACTURING THE SAME

CROSS-REFERENCE TO RELATED APPLICATION

This application claims the priority benefit of Taiwan application serial no. 96149239 on Dec. 21, 2007. The entirety the above-mentioned patent application is hereby incorporated by reference herein and made a part of specification.

BACKGROUND OF THE INVENTION

1. Field of the Invention

The present invention generally relates to a through hole capacitor capable of improving capacitance and a method of manufacturing the same.

2. Description of Related Art

Capacitors on a circuit board are mostly surface mounted device (SMD) elements in conventional art, which are fixed on pads fixed on the circuit board.

With the increasingly complicated functions of IC, the number of pins for connecting other elements on the outside is increased, such that the wiring of the circuit board gets more and more complex, and the installation of the SMD capacitor also occupies the surface area of the IC substrate. Therefore, a circuit board with more layers is required or the area of the circuit board is required to be increased, thus increasing the manufacturing cost.

Further, in order to meet the requirements for multiple functions of electronic products, packaging ICs with different functions into a multi-functional IC module in a 3-dimensional stack is the technical trend of system in package (SiP). With the increasing layers of the stack, the conventional arrangement of SMD capacitors on the circuit board is no longer able to stabilize the voltage in multiple chip stacking.

Accordingly, a through hole capacitor structure capable of reducing the occupied surface area of the circuit board has been developed, as shown in FIG. 1. Referring to FIG. 1, a conventional through hole capacitor 10 includes two conductive layers 104 and 106 in a through hole 102 of a substrate 100 and a dielectric layer 108 between the conductive layers 104 and 106. As the capacitor does not occupy the surface area of the circuit board, it has been disclosed in many patents, for example, Taiwan Patent Publication No. 525417, U.S. Pat. Nos. 6,717,071, 6,518,670, and 6,446,317.

Although the through hole capacitor disclosed in the above patents can save the area of the circuit board, it has a low capacitance. Especially, with the increasing layers of the IC stack, some ICs may require a large transient current, such that a high-capacitance capacitor is required to stable the voltage and current of the entire element.

SUMMARY OF THE INVENTION

Accordingly, the present invention is directed to a through hole capacitor having a high capacitance.

The present invention is further directed to a method of manufacturing a through hole capacitor capable of manufacturing a high-capacitance through hole capacitor.

The present invention provides a through hole capacitor, which at least includes a substrate, an anode layer, a dielectric layer, a first cathode layer, and a second cathode layer. The substrate has a plurality of through holes. The anode layer is disposed on an inner surface of at least one through hole. The surface of the anode layer in at least one through hole is a porous structure. The dielectric layer is disposed on the porous structure of the anode layer. The first cathode layer covers the surface of the dielectric layer. The second cathode layer covers the surface of the first cathode layer. The conductivity of the second cathode layer is greater than that of the first cathode layer.

The present invention further provides a method of manufacturing a through hole capacitor, which includes forming a plurality of through holes in a substrate, and forming an anode layer on an inner layer of at least one through hole; next, performing a surface treatment on the anode layer to make the anode layer be a porous structure, and forming a dielectric layer on the porous structure; then, forming a first cathode layer on the dielectric layer, and forming a second cathode layer on the first cathode layer, in which the conductivity of the second cathode layer is greater than that of the first cathode layer.

As the present invention increases the surface area of the dielectric layer in the through hole capacitor, the capacitance of the through hole capacitor is significantly increased. Furthermore, the embedded through hole capacitor of the present invention is closer to IC requiring a stable voltage than the conventional SMD capacitor, thus achieving better voltage stabilizing effect.

In order to make the features and advantages of the present invention more clear and understandable, the following embodiments are illustrated in detail with reference to the appended drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
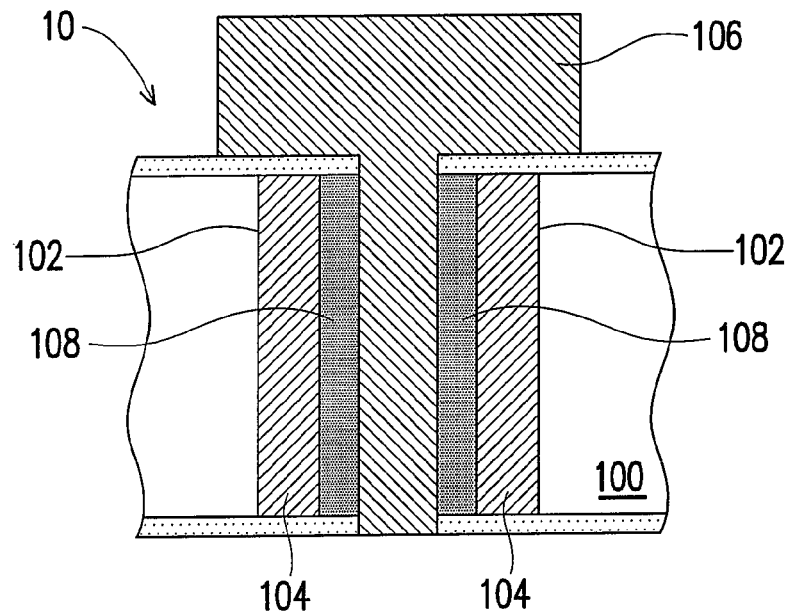
FIG. 1 is a schematic cross-sectional view of a conventional through hole capacitor.

Reference will now be made in detail to the present embodiments of the invention, examples of which are illustrated in the accompanying drawings. Wherever possible, the same reference numbers are used in the drawings and the description to refer to the same or like parts.

Hereinafter, the present invention is illustrated in detail with reference to the following drawings which show embodiments of the present invention. However, the present invention can further be implemented in various manners and should not be limited to the embodiments hereinafter. In practice, the embodiments are provided merely to disclose the present invention more detailed and complete, and to transfer the scope of the present invention to those of ordinary skill in the art completely. The drawings, the sizes of layers and the relevant sizes may be exaggerated for clarity.

Figure 2:
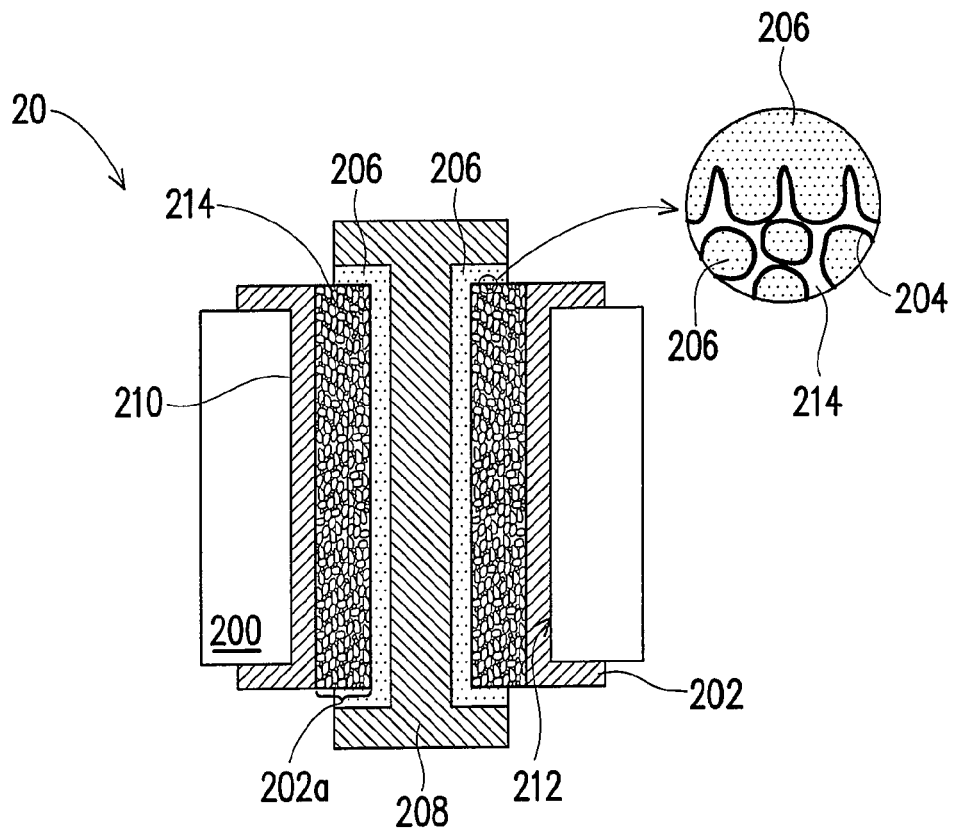
FIG. 2 is a schematic cross-sectional view of a through hole capacitor according to a first embodiment of the present invention.

FIG. 2 is a schematic cross-sectional view of a through hole capacitor according to a first embodiment of the present invention.

Referring to FIG. 2, a through hole capacitor 20 of the first embodiment includes a substrate 200, an anode layer 202, a dielectric layer 204, a first cathode layer 206, and a second cathode layer 208. The substrate 200 has a through hole 210. In the first embodiment, the substrate 200 is a silicon substrate and can further be an insulating substrate or a metal substrate. Although merely one through hole 210 and one through hole capacitor 20 are shown in FIG. 2, the substrate 200 can further has other through holes, which can be disposed with the through hole capacitors and can further serve as a portion of the circuit wiring. Further, a plurality of through hole capacitors can be connected in parallel to one another completely or partially. The through holes in the substrate can be arranged in an array. Furthermore, the first embodiment is described with a cross section which merely illustrates an ideal situation, and thus may have slight difference with the actual shape due to manufacturing process and/or tolerance. Therefore, the present invention should not be interpreted to be limited to the specific shape described in the first embodiment and can have other practicable shapes. For example, the through hole 210 in FIG. 2 is generally considered to be a circular hole, but the through hole 210 of the present invention can further be a rectangular through hole or a hexagonal through hole and the like. Therefore, the cross-section view is schematic in essence, and the shape does not mean the accurate shape of elements and is not used to limit the scope of the present invention.

Referring to FIG. 2 again, the anode layer 202 is disposed on an inner surface 212 of the through hole 210, and a material of the anode layer 202 includes aluminum (Al), tantalum (Ta), niobium (Nb), or niobium monoxide (NbO). Further, a surface 202a of the anode layer 202 is a porous structure 214, as shown by an enlarged drawing on the upper right part of FIG. 2. The dielectric layer 204 is disposed on the porous structure 214 of the anode layer 202. For example, when the anode layer 202 is an aluminum layer, and the porous structure 214 is a structure of aluminum after etching, the dielectric layer 204 is aluminum oxide ($Al_2O_3$) formed on the porous structure 214 of the porous structure 214 after the anodic oxidation. The porous structure 214 is also referred to as a spongy structure. The first cathode layer 206 covers the surface of the dielectric layer 204, and a material of the first cathode layer 206 is, for example, an organic semiconductor, an inorganic semiconductor or an organic-inorganic hybrid conductive material. The inorganic semiconductor is, for example, manganese dioxide ($MnO_2$). The organic semiconductor is, for example, charge transfer complex or conductive polymer. The conductive polymer is, for example, polypyrrole, polythiophene, polyaniline, or another suitable conductive polymer. The material of the first cathode layer 206 can also be a single conductive polymer or two mixed conductive polymers. The first cathode layer 206 can also be a conductive polymer, or manganese dioxide, or a double-layer structure of conductive polymer and manganese dioxide, but not limited to the single layer structure in the first embodiment.

Referring to FIG. 2 again, due to the self-healing function, the material of the first cathode layer 206 is capable of being self-insulated in high leakage current area, so as to reduce the leakage current of the capacitor. The second cathode layer 208 fills up the through hole 210 to cover the first cathode layer 206, and the conductivity of the second cathode layer 208 is greater than that of the first cathode layer 206. When the first cathode layer 206 and the second cathode layer 208 are signal transmission layers, the through hole capacitor can be used for impedance control. The second cathode layer 208 includes a carbon- and metal-containing composite layer, and the metal in the composite layer includes silver, copper, gold, or nickel. That is, the material of the second cathode layer 208 can be C/Ag, C/Cu, or C/Au. The second cathode layer 208 can also be a pure metal layer. The second cathode layer 208 fills up the through hole.

Figure 3:
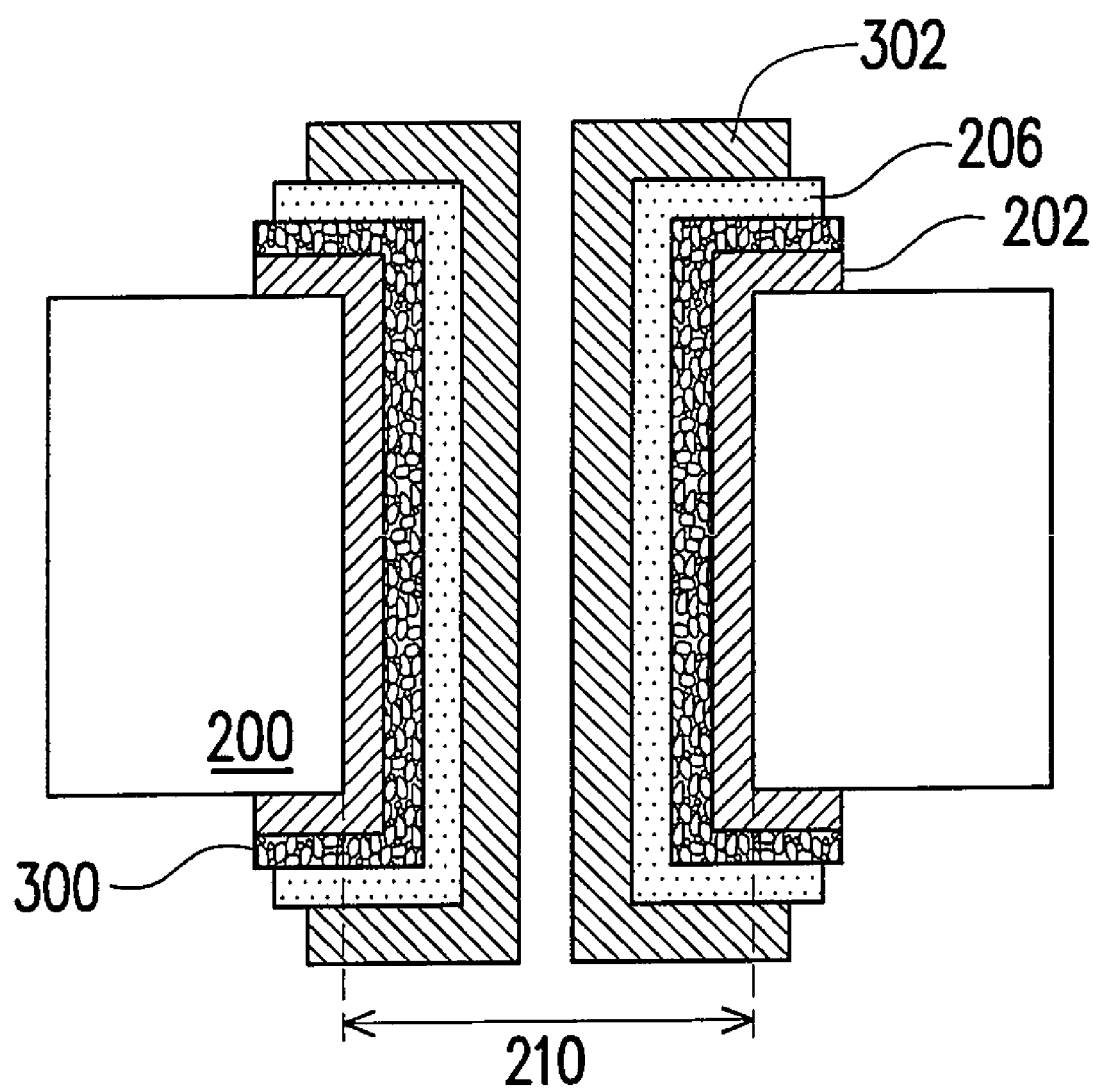
FIG. 3 is a schematic cross-sectional view of a through hole capacitor according to a variation of FIG. 2.

FIG. 3 is a schematic cross-sectional view of a through hole capacitor according to a variation of FIG. 2, in which the same reference numerals indicate the same elements in FIG. 2. Referring to FIG. 3, the main difference between FIG. 3 and FIG. 2 lies in that a porous structure 300 of the anode layer 202 extends to a surface of the substrate 200 out of the through hole 210. In other words, the dielectric layer (not marked) will extend to the surface of the substrate 200 out of the through hole 210, and thus the contact area between the dielectric layer (not marked) and the anode layer 202 is increased. The second cathode layer 302 merely covers the surface of the first cathode layer 206.

The surface area of the various through hole capacitors of the first embodiment can be increased to be more than tens of times of that of the conventional through hole capacitor, thus significantly increasing the capacitance of the through hole capacitor. Furthermore, the through hole capacitor of the present invention is closer to IC requiring a stable voltage than the conventional surface mounted device (SMD) capacitor, thus achieving better voltage stabilizing effect.

Figure 4:
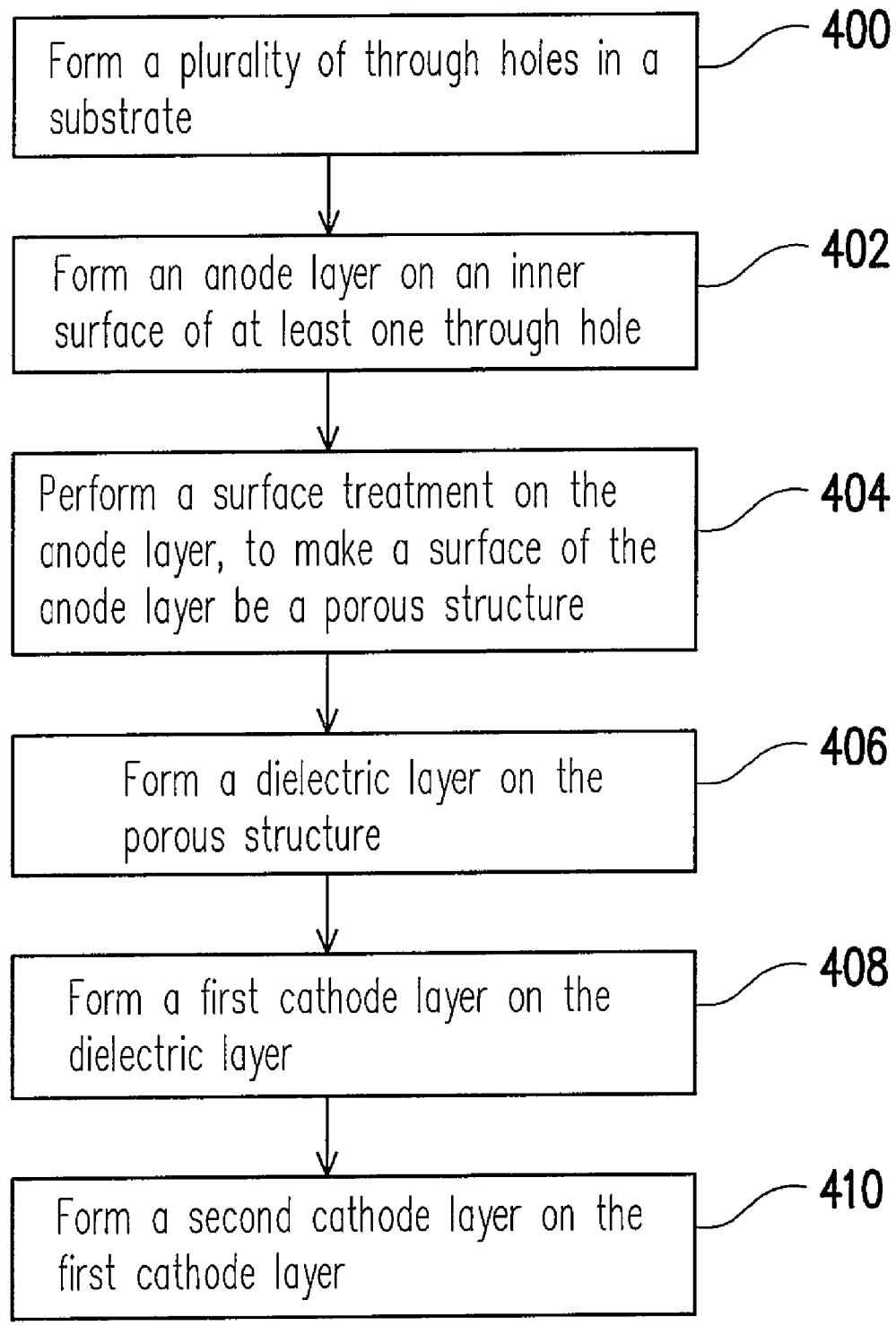
FIG. 4 is a flow chart of manufacturing processes of a through hole capacitor according to a second embodiment of the present invention.

FIG. 4 is a flow chart of manufacturing processes of a through hole capacitor according to a second embodiment of the present invention.

Referring to FIG. 4, in Step 400, a plurality of through holes is formed in a substrate. The substrate is, for example, a silicon substrate, an insulating substrate, or a metal substrate.

In Step 402, an anode layer is formed on an inner surface of at least one through hole. A material of the anode layer is, for example, aluminum, tantalum, niobium, or niobium monoxide.

Next, in Step 404, a surface treatment is performed on the anode layer to make a surface of the anode layer be a porous structure. The surface treatment is, for example, an etching process or another process capable of roughening the surface of the anode layer. For example, when the material of the anode layer is aluminum, etching can be performed by using hydrochloric acid, sulfuric acid, phosphoric acid, or a mixture thereof.

In Step 406, a dielectric layer is formed on the porous structure. The method of forming the dielectric layer is, for example, anodic oxidation. For example, when the material of the anode layer is aluminum, the anode layer can be oxidized into aluminum oxide ($Al_2O_3$) to serve as the dielectric layer through electrochemical anodic oxidation. Further, another layer of dielectric material can be further deposited on the surface of the porous structure after oxidation.

Then, in Step 408, a first cathode layer is formed on the dielectric layer, and a material of the first cathode layer is, for example, an organic semiconductor, an inorganic semiconductor, or an organic-inorganic hybrid conductive material. The inorganic semiconductor is, for example, such as manganese dioxide ($MnO_2$). The organic semiconductor is, for example, charge transfer complex or conductive polymer. The conductive polymer is, for example, polypyrrole, polythiophene, or polyaniline. Further, when the material of the first cathode layer is a conductive polymer, a single conductive polymer or two mixed conductive polymers are available.

In Step 410, a second cathode layer is formed on the first cathode layer, and the conductivity of the second cathode layer is greater than that of the first cathode layer. The method of forming the second cathode layer includes, for example, filling a conductive glue into the through hole, sputtering, electroplating, chemical vapor deposition, or a combination thereof for plating the second cathode layer on the first cathode layer. A material of the second cathode layer is, for example, a carbon- and metal-containing composite material. The metal in the composite material is, for example, silver, copper, gold, or nickel. Further, the second cathode layer can also be a pure metal layer.

In view of the above, as the through hole capacitor of the present invention has the anode layer having a porous structure, the surface area of the dielectric layer is significantly increased, thus significantly increasing the capacitance of the through hole capacitor. Therefore, the through hole capacitor of the present invention is applicable in the three-dimensional package structure having a large quantity of IC stacked layers. The through holes provide IC signal transmission between different layers, and the through hole capacitors are used to stabilize the voltage of the multi-layered IC. As the through hole capacitors are designed in the multi-layered IC stacked structure, a better voltage stabilizing effect than independent SMD capacitors conventionally arranged on the circuit board can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A through hole capacitor, at least comprising:
   a substrate, comprising a plurality of through holes;
   an anode layer, disposed on an inner surface of at least one through hole, wherein a surface of the anode layer in the at least one through hole is a porous structure;
   a dielectric layer, disposed on the porous structure of the anode layer;
   a first cathode layer, covering a surface of the dielectric layer; and
   a second cathode layer, covering a surface of the first cathode layer, wherein a conductivity of the second cathode layer is greater than that of the first cathode layer.

2. The through hole capacitor according to claim 1, wherein a material of the anode layer comprises aluminum (Al), tantalum (Ta), niobium (Nb), or niobium monoxide (NbO).

3. The through hole capacitor according to claim 1, wherein the dielectric layer extends to a surface of the substrate out of the through hole.

4. The through hole capacitor according to claim 1, wherein a material of the first cathode layer comprises an organic semiconductor, an inorganic semiconductor, or an organic-inorganic hybrid conductive material.

5. The through hole capacitor according to claim 4, wherein the inorganic semiconductor comprises manganese dioxide ($MnO_2$).

6. The through hole capacitor according to claim 4, wherein the organic semiconductor comprises a charge transfer complex or a conductive polymer.

7. The through hole capacitor according to claim 6, wherein the conductive polymer comprises polypyrrole, polythiophene, or polyaniline.

8. The through hole capacitor according to claim 6, wherein a material of the first cathode layer comprises a single conductive polymer or two mixed conductive polymers.

9. The through hole capacitor according to claim 1, wherein the first cathode layer comprises a conductive polymer, manganese dioxide, or a double-layer structure of conductive polymer and manganese dioxide.

10. The through hole capacitor according to claim 1, wherein the second cathode layer comprises a carbon- and metal-containing composite layer.

11. The through hole capacitor according to claim 10, wherein the metal in the composite layer comprises silver, copper, gold, or nickel.

12. The through hole capacitor according to claim 1, wherein the second cathode layer comprises a pure metal layer.

13. The through hole capacitor according to claim 1, wherein the second cathode layer fills up the through hole.

14. The through hole capacitor according to claim 1, wherein the substrate comprises a silicon substrate, an insulating substrate, or a metal substrate.

15. The through hole capacitor according to claim 1, wherein the through holes in the substrate are arranged in an array.

16. The through hole capacitor according to claim 1, wherein the through hole capacitors in the substrate are connected in parallel to one another completely or partially.

17. The through hole capacitor according to claim 1, wherein the first cathode layer and the second cathode layer is a ground layer or a signal transmission layer used for impedance control.

18. A method of manufacturing a through hole capacitor, comprising:
   forming a plurality of through holes in a substrate;
   forming an anode layer on an inner surface of at least one through hole;
   performing a surface treatment on the anode layer, to make a surface of the anode layer be a porous structure;
   forming a dielectric layer on the porous structure;
   forming a first cathode layer on the dielectric layer; and
   forming a second cathode layer on the first cathode layer, wherein a conductivity of the second cathode layer is greater than that of the first cathode layer.

19. The method of manufacturing a through hole capacitor according to claim 18, wherein the surface treatment comprises an etching process.

20. The method of manufacturing a through hole capacitor according to claim 18, wherein a method of forming the dielectric layer comprises anodic oxidation.

21. The method of manufacturing a through hole capacitor according to claim 18, wherein a material of the anode layer comprises aluminum (Al), tantalum (Ta), niobium (Nb), or niobium monoxide (NbO).

22. The method of manufacturing a through hole capacitor according to claim 18, wherein a material of the first cathode layer comprises an organic semiconductor, an inorganic semiconductor, or an organic-inorganic hybrid conductive material.

23. The method of manufacturing a through hole capacitor according to claim 22, wherein the inorganic semiconductor comprises manganese dioxide ($MnO_2$).

24. The method of manufacturing a through hole capacitor according to claim 22, wherein the organic semiconductor comprises a charge transfer complex or a conductive polymer.

25. The method of manufacturing a through hole capacitor according to claim 24, wherein the conductive polymer comprises polypyrrole, polythiophene, or polyaniline.

26. The method of manufacturing a through hole capacitor according to claim 24, wherein a material of the first cathode layer comprises a single conductive polymer or two mixed conductive polymers.

27. The method of manufacturing a through hole capacitor according to claim 18, wherein a material of the second cathode layer comprises a carbon- and metal-containing composite material.

28. The method of manufacturing a through hole capacitor according to claim 27, wherein the metal in the composite material comprises silver, copper, gold, or nickel.

29. The method of manufacturing a through hole capacitor according to claim 18, wherein the second cathode layer comprises a pure metal layer.

30. The method of manufacturing a through hole capacitor according to claim 18, wherein a method of forming the second cathode layer comprises coating the second cathode layer on a surface of the first cathode layer in at least one through hole by filling a conductive glue, sputtering, electroplating, chemical vapor deposition, or a combination thereof.

31. The method of manufacturing a through hole capacitor according to claim 18, wherein the substrate comprises a silicon substrate, an insulating substrate, or a metal substrate.

32. The method of manufacturing a through hole capacitor according to claim 18, wherein the through hole capacitors in the substrate are connected in parallel to one another completely or partially.

33. The method of manufacturing a through hole capacitor according to claim 18, wherein when the first cathode layer and the second cathode layer are signal transmission layers, the through hole capacitor is used for impedance control.

* * * * *